(12) United States Patent
Farrar

(10) Patent No.: US 6,717,191 B2
(45) Date of Patent: Apr. 6, 2004

(54) ALUMINUM-BERYLLIUM ALLOYS FOR AIR BRIDGES

(75) Inventor: Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/349,015

(22) Filed: Jan. 21, 2003

(65) Prior Publication Data

US 2003/0127741 A1 Jul. 10, 2003

Related U.S. Application Data

(63) Continuation of application No. 09/119,355, filed on Jul. 20, 1998, now Pat. No. 6,509,590.

(51) Int. Cl.[7] .......................... C22C 21/00; H01L 23/58; H01L 29/04
(52) U.S. Cl. ................. 257/276; 257/503; 257/508; 257/522; 257/771; 257/746; 257/741; 257/744; 257/764; 257/765; 257/758
(58) Field of Search ................. 257/276, 503, 257/508, 522, 771, 746, 741, 744, 764, 765, 758

(56) References Cited

U.S. PATENT DOCUMENTS

| 1,254,987 A | 1/1918 | Cooper | |
|---|---|---|---|
| 1,976,375 A | 10/1934 | Smith | 148/11.5 |
| 2,244,608 A | 6/1941 | Cooper | 75/138 |
| 3,147,110 A | 9/1964 | Foerster | 75/122.5 |
| 3,337,334 A | 8/1967 | Fenn et al. | 75/150 |
| 3,506,438 A | 4/1970 | Krock et al. | 75/208 |
| 3,548,915 A | 12/1970 | Richmond et al. | 164/68 |
| 3,548,948 A | 12/1970 | Richmond et al. | 164/68 |
| 3,687,737 A | 8/1972 | Krock et al. | 148/2 |
| 3,832,456 A | 8/1974 | Kobetz et al. | 423/645 |
| 3,923,500 A | 12/1975 | Kitazawa et al. | 75/156.5 |
| 4,022,931 A | 5/1977 | Black et al. | 427/91 |

(List continued on next page.)

OTHER PUBLICATIONS

"Phase Diagrams", *Metals Handbook, 10th Ed.*, vol. 3, (1992).

"Properties and Selection: Nonferrous Alloys and PUre Metals", *Metals Handbook, 9th ed.*, vol. 2, (1979).

Dudzinski, N.., et al., "Youngs Modulus of Some Aluminum Alloys", *J. Institute of Metals*, vol. LXXIV, (1947–48),pp. 291–314.

Singer, Ferdinad.L., *Strength of Materials*, Harper & Brothers,(1951),229–32.

Van Horn, K., R. , "Aluminim vol. 1 Properties Physical Metallurgy and Phase Diagrams", *American Society for Metals*, Metals Park, OH,(1967), Wolf, S., "Chapter 4: Multilevel–Interconnect Technology for VLSI and ULSI", In: *Silicon Processing for the VLSI Era, vol. 2 Process Integration*, Lattice Press, Sunset Beach, CA,(1990), 176–297.

*Primary Examiner*—Alexander Oscar Williams
(74) *Attorney, Agent, or Firm*—Schwegman, Lundberg, Woessner & Kluth, P.A.

(57) ABSTRACT

A typical air bridge is an aluminum conductor suspended across an air-filled cavity to connect two components of an integrated circuit, two transistors for example. The air-filled cavity has a low dielectric constant which reduces cross-talk between neighboring conductors and improves speed and efficiency of the integrated circuit. However, current air bridges must be kept short because typical aluminum conductors sag too much. Accordingly, one embodiment of the invention forms air-bridge conductors from an aluminum-beryllium alloy, which enhances stiffness and ultimately provides a 40-percent improvement in air-bridge lengths.

36 Claims, 2 Drawing Sheets

U.S. PATENT DOCUMENTS

| | | | |
|---|---|---|---|
| 4,029,377 A | 6/1977 | Guglielmi | 339/19 |
| 4,065,330 A | 12/1977 | Masumoto et al. | 148/31.55 |
| 4,101,855 A | 7/1978 | Drapeau | 335/106 |
| 4,158,719 A | 6/1979 | Frantz | 428/567 |
| 4,233,066 A | 11/1980 | Sundin et al. | 75/142 |
| 4,314,594 A | 2/1982 | Pfeifer et al. | 148/108 |
| 4,389,429 A | 6/1983 | Soclof | 438/492 |
| 4,561,173 A | 12/1985 | Te Velde | 438/619 |
| 4,709,359 A | 11/1987 | Loftin | 367/155 |
| 5,045,635 A | 9/1991 | Kaplo et al. | 174/35 GC |
| 5,148,260 A | 9/1992 | Inoue et al. | 357/67 |
| 5,231,036 A | 7/1993 | Miyauchi et al. | |
| 5,324,683 A | 6/1994 | Fitch et al. | 437/65 |
| 5,324,684 A | 6/1994 | Kermani et al. | 437/95 |
| 5,336,914 A | 8/1994 | Andoh | 257/368 |
| 5,399,897 A | 3/1995 | Cunningham et al. | 257/467 |
| 5,408,742 A | 4/1995 | Zaidel et al. | 29/846 |
| 5,424,030 A | 6/1995 | Takahashi | 420/473 |
| 5,444,015 A | 8/1995 | Aitken et al. | 437/182 |
| 5,457,344 A | 10/1995 | Bartelink | 257/737 |
| 5,485,037 A | 1/1996 | Marrs | 257/712 |
| 5,578,146 A | 11/1996 | Grant et al. | 148/437 |
| 5,725,689 A | 3/1998 | Nishida et al. | 148/320 |
| 5,852,871 A | 12/1998 | Khandros | 29/843 |
| 5,891,797 A | 4/1999 | Farrar | 438/619 |
| 5,994,777 A | 11/1999 | Farrar | 257/758 |
| 6,015,738 A | 1/2000 | Levy et al. | 438/275 |
| 6,025,261 A | 2/2000 | Farrar et al. | 438/619 |
| 6,057,226 A | 5/2000 | Wong | 438/623 |
| 6,075,278 A | 6/2000 | Farrar | 257/522 |
| 6,075,287 A | 6/2000 | Ingraham et al. | |
| 6,091,475 A | 7/2000 | Ogino et al. | 349/149 |
| 6,204,065 B1 | 3/2001 | Ochiai | 436/66 |
| 6,265,811 B1 | 7/2001 | Takeuchi et al. | |
| 6,288,905 B1 | 9/2001 | Chung | 361/771 |
| 2001/0054771 A1 | 12/2001 | Wark et al. | |

ALUMINUM-BERYLLIUM ALLOYS FOR AIR BRIDGES

This application is a Continuation of U.S. application Ser. No. 09/119,355 filed Jul. 20, 1998 now U.S. Pat. No. 6,509,590 which is incorporated herein by reference.

FIELD OF INVENTION

The present invention concerns integrated circuits, particularly metals for forming air-bridge interconnects.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, with aluminum wires to define a specific electric circuit, such as a computer memory. The aluminum wires, normally embedded in insulation, are typically about one micron thick, or about 100 times thinner than a human hair.

As integrated circuits have become progressively smaller and more densely packed, the wiring connecting components has inevitably been spaced closer together. Unfortunately, this closer spacing has increased capacitance between wires. Increased capacitance not only causes cross talk—undesirable signal mixing between adjacent wires—but also wastes power and slows response of integrated circuits to electrical signals. Thus, fabricators are generally concerned with ways to reduce capacitance.

One way to reduce capacitance between the wires is to separate them with an insulation better than silicon dioxide, the most prevalent insulation material. Insulations are rated in terms of a dielectric constant, with lower dielectric constants giving rise to less capacitance than higher dielectric constants. Thus, to reduce capacitance, one can replace the typical silicon-dioxide insulation, which has a dielectric constant of about 4, with an insulator having a lower dielectric constant.

Air, which has a dielectric constant of about 1, is one such insulator. In fact, there are very few, if any, practical insulators with a lower dielectric constant. To use air as an insulator, fabricators have developed an interconnect structure called an air bridge—a conductive wire that extends through an air-filled space of an integrated circuit. Most commonly, the microscopic wire bridges a space between two pillars that support its ends. Two air bridges can be placed side by side such that air separates their respective wires, thereby dramatically reducing capacitance between the two wires.

Unfortunately, conventional fabrication techniques are limited to making short air bridges, typically with unsupported, or free-span, lengths about 1 millimeter long (assuming a 500-nanometer thickness and a maximum allowable sag of 250 nanometers). The air bridges must be kept short because the typical aluminum alloy used to make air-bridge conductors is too supple and the conductors sag in the middle, sometimes forming short circuits with other conductors or even breaking. This aluminum alloy includes small amounts of copper and silicon to enhance its electromigration resistance, that is, its resistance to disintegration at high current levels, but nothing to promote its stiffness, or rigidity.

Theoretically, one can enhance rigidity of any given alloy by adding metals known for their rigidity to the alloy. However, most metals that would enhance rigidity of the typical aluminum alloy also substantially increase its density (mass per unit volume) or its electrical resistance, generally rendering the resulting wires too heavy or too electrically resistive to benefit air-bridge applications. For example, adding 25 weight-percent iron, a rigid metal, to the typical aluminum alloy would increase its rigidity about 4 percent but increase its density about 20 percent and its electrical resistance (per unit length) about 15 percent. Increased density makes wires heavier, more prone to sag, and thus less apt to improve air-bridge lengths, while increased resistance wastes power, slows down integrated circuits, and thus offsets the promised advantages of using longer air bridges.

Accordingly, to achieve longer, performance-enhancing air bridges, there remains a need for alloys which have not only better rigidity but also appropriately low electrical resistance and mass density.

SUMMARY OF THE INVENTION

To address these and other needs, the inventor has developed new aluminum-beryllium alloys which, compared to the conventional aluminum alloy, have superior rigidity and comparable electrical resistance. Specifically, one alloy within the scope of the invention contains 25 weight-percent beryllium and 0.5 weight-percent copper, with the balance being aluminum and reasonably unavoidable impurities. This alloy provides an elastic-modulus-to-density (E/p) ratio (a measure of rigidity) of 40.9 Gpam3/Mg and an electrical resistance of 31.3 nano-ohm-meters (nΩm). In contrast, a conventional aluminum alloy has an elastic-modulus-to-density ratio of about 25.4 GPam$^3$/Mg and an electrical resistance of 28.2 nano-ohm-meters. Thus, this aluminum-beryllium alloy is about 60 percent more rigid with only about 10 percent more electrical resistance than the conventional aluminum alloy. Moreover, all other factors being equal, this aluminum-beryllium alloy facilitates construction of air bridges that are 40-percent longer than bridges using the conventional aluminum alloy. Thus, the present invention promotes integrated circuits with superior speed and efficiency.

DESCRIPTION OF THE PREFERRED EMBODIMENTS

The following detailed description, which references and incorporates FIGS. 1–6, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Definitions

The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

The term "cavity" as used herein refers to a bounded, three-dimensional region having a dielectric constant different from areas outside the region. Thus, for example, the term "cavity" encompasses gas-filled regions, liquid-filled regions, gas-liquid-filled regions, porous regions, and vacuum regions.

The term "percent" (%) in the context of a material composition refers to weight percent unless otherwise noted.

Exemplary Air-Bridge Fabrication Method

Figure 1:
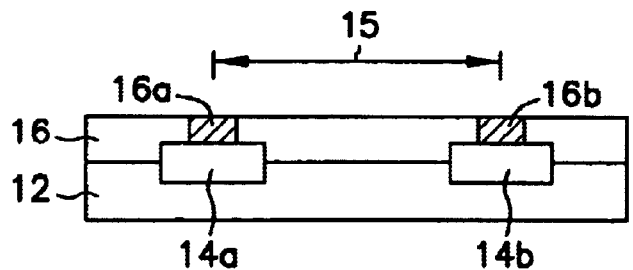
FIG. 1 is a cross-sectional view of an integrated-circuit assembly at an early stage of fabrication.

FIGS. 1–6 show a number of exemplary integrated-circuit assemblies, which taken collectively and sequentially, illustrate an exemplary method of fabricating an integrated circuit including an extra-long air bridge consistent with the present invention. The method, as shown in FIG. 1, a cross-sectional view, begins with a known integrated-circuit assembly or structure 10, which may reside within any integrated circuit, for example, an otherwise conventional integrated memory circuit.

Assembly 10 includes a substrate 12, which supports a number of integrated elements 14, particularly transistors 14a and 14b. Transistors 14a and 14b are covered by a 100-nanometer-thick, insulative layer 16, which for example consists of a silicon oxide, nitride, or oxynitride. Layer 16 includes two tungsten vias (or contact plugs) 16a and 16b electrically connected to respective transistors 14a and 14b. Although omitted from FIGS. 1–5 for clarity, assembly 10, in some embodiments, includes a titanium-nitride (TiN) diffusion barrier between vias 16a and 16b and transistors 14a and 14b. Transistors 14a and 14b and corresponding vias 16a and 16b are separated by a distance 15 of 1.4 millimeters, which is approximately 40 percent longer than the one-millimeter maximum free-span length of conventional aluminum-alloy air bridges, assuming a 500 nanometer thickness and a maximum allowable sag of 250 nanometers. One of skill in the art, however, understands that using different thicknesses, maximum-allowable sags, and/or breaking-point constraints would provide other maximum free-span lengths, both greater and less than the strictly exemplary 1.4 millimeters mentioned here.

Figure 2:
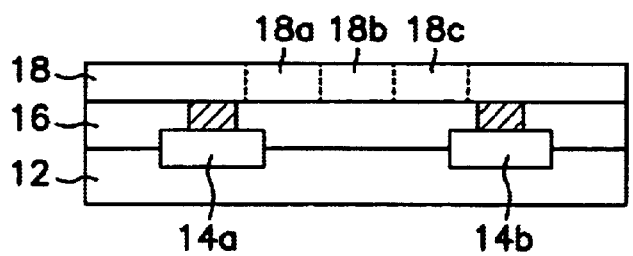
FIG. 2 is a cross-sectional view of the FIG. 1 integrated-circuit assembly after formation of an insulative layer 18 including portions 18a, 18b, and 18c.

FIG. 2 shows the beginning of the exemplary air-bridge fabrication method. The method deposits or grows an insulative material layer 18 atop layer 16. Examples of suitable insulative material include photoresist and silicon dioxide. Layer 18 includes three portions 18a, 18b, and 18c.

Figure 3:
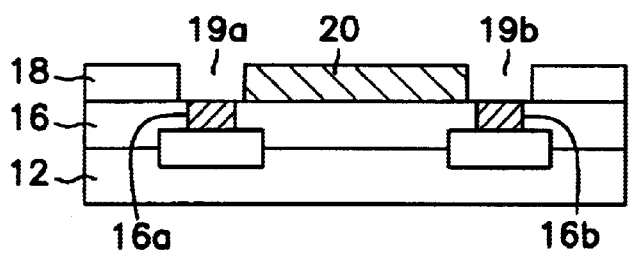
FIG. 3 is a cross-sectional view of the FIG. 2 assembly after replacement of portions 18a, 18b, and 18c with a filler material 20 and formation of holes 19a and 19b.

FIG. 3 shows that the method next entails removing portions 18a, 18b, and 18c, using any selective-material-removal technique, etching for example. Then, the spaces previously occupied by portions 18a–18c are filled with a sacrificial filler material 20 and subsequently planarized. Examples of suitable filler material include silicon nitride and numerous polymers. Other embodiments leave portion 18b to serve as an intermediate air-bridge support, facilitating construction of longer and/or thinner bridges. Two holes 19a and 19b, which will define conductive air-bridge supports, are also formed in layer 18, exposing portions of respective vias 16a and 16b.

Figure 4:
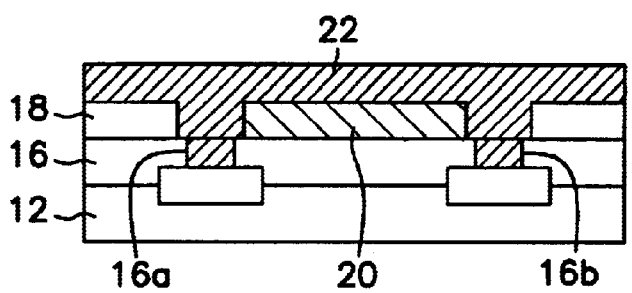
FIG. 4 is a cross-sectional view of the FIG. 3 assembly after formation of an aluminum-beryllium layer 22 on material 20 and in holes 19a and 19b.

Afterwards as shown in FIG. 4, the method forms a 500-nanometer-thick aluminum-beryllium (Al—Be) layer 22 over the first insulative layer 18 and filler material 20 and into holes 19a and 19b. In the exemplary embodiment, aluminum-beryllium layer 22 consists essentially of 25% beryllium and 0.5% copper, with the remainder being aluminum and reasonably unavoidable impurities. (Commercially available raw aluminum, which is about 99% pure, generally contains negligible quantities of iron, silicon, and other impurities.) This particular alloy has a density ($\rho$) of approximately 2.42 Mg/m$^3$, a Young's Modulus of Elasticity (E) of approximately 99 GPa, and an electrical resistance of 31.3 n$\Omega$m. Therefore, the ratio of elasticity to density (E/$\rho$), a measure of rigidity, is approximately 40.9 GPam$^3$/Mg. In contrast, the aluminum-silicon-copper alloy common to most internal integrated-circuit conductors (1% copper and 0.5% silicon) has a resistance of about 28.2 n$\Omega$m and an E/$\rho$ of 25.4 GPam$^3$/Mg. In general, the maximum free-span length, based on break point or maximum allowable sag, is proportional to the E/$\rho$ for the bridge metal. More precisely, the maximum free-span length, for most practical integrated-circuit applications, adheres to the following approximation:

$$L = \sqrt[4]{32E\delta t^2/5\rho} \text{ or } \approx 1.6 \, (E\delta/\rho)^{1/4} t^{1/2}$$

where L denotes the free-span length; E denotes the modulus of elasticity of the bridge alloy; $\delta$ (delta) denotes the maximum allowable deflection, or sag, of the bridge; $\rho$ (rho) is the bridge-alloy density; and t is the thickness of the bridge (in the deflection direction). Thus, with all other factors being equal, the 60% greater E/$\rho$ for the exemplary aluminum-beryllium alloy makes it possible to form air-bridges that are approximately 40% longer.

Other embodiments of the invention use other aluminum-beryllium alloys, which contain different amounts of beryllium and copper. Some even include titanium. In general, the beryllium and titanium enhance rigidity, and the copper enhances electromigration resistance. Below, Table 1 summarizes the alloys of various embodiments of the invention.

TABLE 1

Aluminum Alloys with Enhanced Rigidity and Low Resistance

| Beryllium % | Copper % | Titanium % |
|---|---|---|
| 1–40 | 0–6 | 0–2 |
| 1–40 | 0.2–2 | 0–2 |
| 1–40 | 0–6 | 0.5–1 |
| 1–40 | 0–6 | <0.1 |
| 1–40 | 0.2–1 | <0.1 |
| 15–30 | 0–6 | 0–2 |
| 15–30 | 0.2–2 | 0–2 |
| 20–30 | 0.2–1 | <0.1 |
| 20–30 | 0.4–0.6 | <0.1 |
| 20–30 | 0.4–0.6 | 0–2 |
| 24–26 | 0.4–0.6 | <0.1 |

Aluminum-beryllium layer 22 may be formed using a wide variety of techniques. The exemplary embodiment forms the layer using conventional sputtering from an alloy target of the desired composition. Other embodiments follow a layered approach which uses two targets, one of beryllium and the other of aluminum, aluminum-copper, aluminum-titanium or aluminum-copper-titanium. In this approach, one or more layers of each target material are used to realize the desired composition. And, still other embodiments use chemical-vapor deposition or even jet-vapor deposition. Thus, the present invention is not restricted to any particular method or class of methods for forming aluminum-beryllium layer 22.

Figure 5:
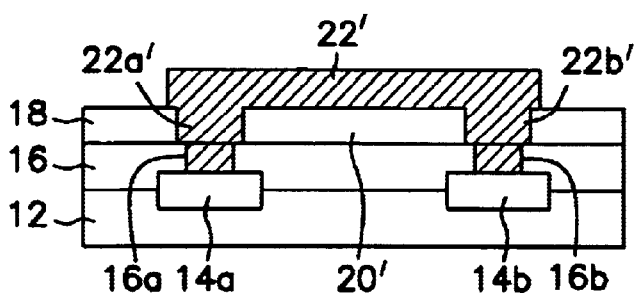
FIG. 5 is a cross-sectional view of the FIG. 4 assembly after patterning layer 22 into a conductor 22' and removing filler material 20 to form cavity 20'.

FIG. 5 shows the results of the next series of operations. After its formation, aluminum-beryllium layer 22 is patterned to form a 167-nanometer-wide aluminum-beryllium air-bridge conductor 22' that includes end supports 22a' and 22b'. The exemplary embodiment uses conventional photolithography and etching to form the aluminum-beryllium conductor from layer 22. However, other embodiments follow a single- or dual-damascene approach which generally entails etching a trench in layer 18 and material, filling the trench with the aluminum-beryllium alloy, and then removing excess alloy to form the conductor.

The exemplary embodiments provides conductor 22' with a rectangular cross-section and a height-to-width, or aspect, ratio of 3:1. Other embodiments, generally less suitable to mass production, form the conductor with any number of alternative aspect ratios as well as cross-sectional sizes and shapes. For example, one embodiment provides conductor 22' with a 4:1 aspect ratio, and another provides conductor 22' with a square shape.

Subsequent to formation of the extra-long bridge conductor, the method removes filler material 20 to leave a cavity 20' underneath air-bridge conductor 22'. Cavity 20' in the exemplary embodiment is filled with air. However, other embodiments fill the cavity with other gases, or even a porous insulator.

Examples of other air-bridge structures which would benefit from incorporating one or more alloys of the present invention include double- and triple-wide and multilevel bridge structures. These and other structures are disclosed in co-assigned U.S. patent application Ser. No. 08/954,450, which was filed on Oct. 20, 1997, now U.S. Pat. No. 5,891,797 and is incorporated herein by reference. Moreover, the alloys may be used with other air-bridge fabrication methods. See, for example, U.S. Pat. No. 5,510,645 entitled Semiconductor Structures Having an Air Region and Method of Forming the Semiconductor Structure and U.S. Pat. No. 5,324,684 entitled Method of Forming Semiconductor Structure Having an Air Region, both incorporated herein by reference.

Figure 6:
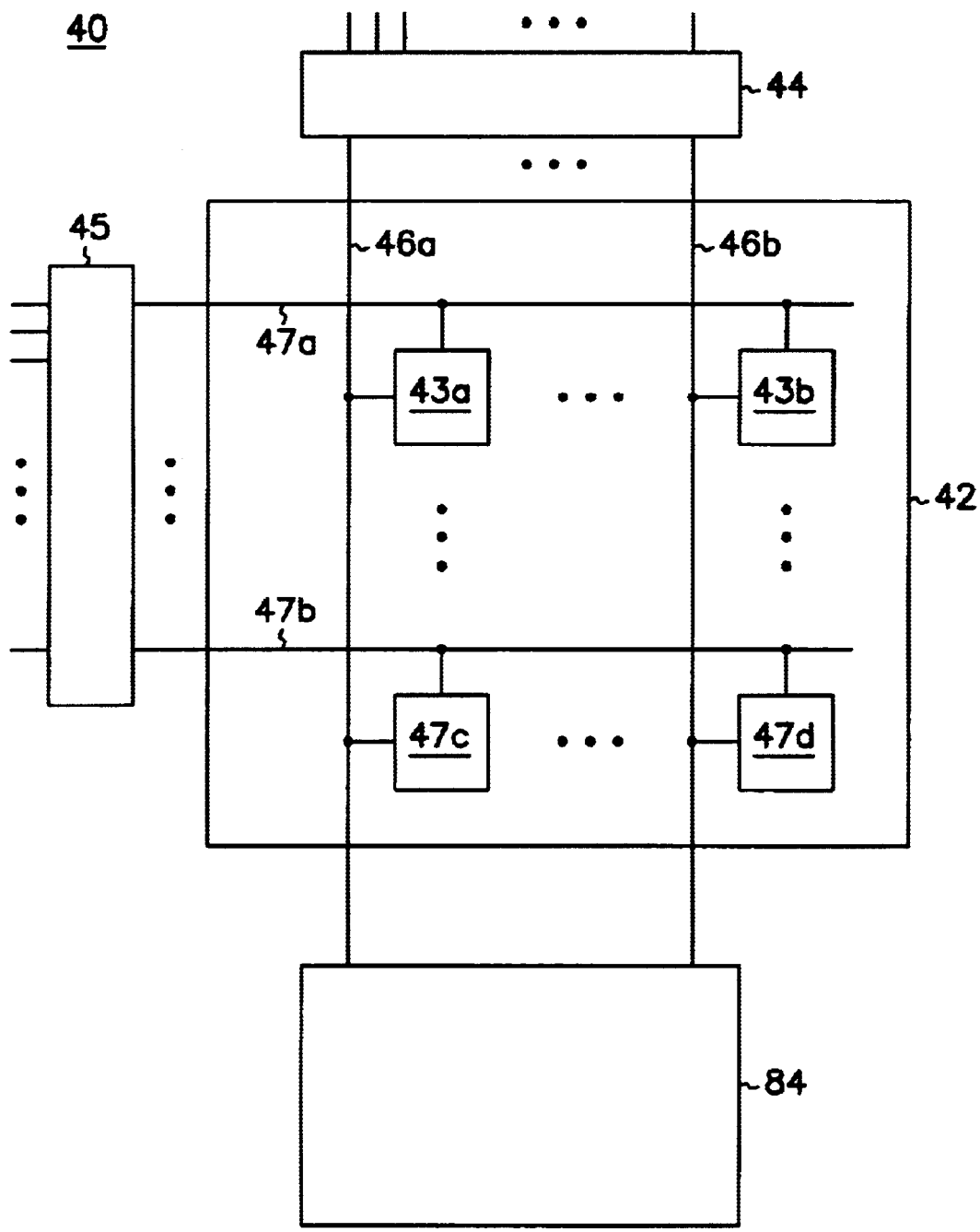
FIG. 6 is a block diagram of a generic integrated memory circuit incorporating one or more air bridges of the present invention.

Exemplary Embodiment of an Integrated Memory Circuit Incorporating an Aluminum-Beryllium Air Bridge FIG. 6 shows one example of the unlimited number of integrated circuits which would benefit from incorporation of the aluminum-beryllium air bridges of the present invention: a generic integrated memory circuit 40. Memory circuit 40, which operates according to well-known and understood principles, is generally coupled to a processor (not shown) to form a computer system. More particularly, circuit 40 includes a memory array 42 which comprises a number of memory cells 43, a column address decoder 44, and a row address decoder 45, bit lines 46, word lines 47, and voltage-sense-amplifier circuit 48 coupled in conventional fashion to bit lines 46.

In the exemplary embodiment, the memory cells, the address decoders, and amplifier circuit are interconnected via at least one aluminum-beryllium air bridge of the present invention. However, in other embodiments, only certain components, for example memory array 42 and voltage-sense-amplifier circuit 48, are interconnected via aluminum-beryllium air-bridges.

Conclusion

In furtherance of the art, the inventor has developed new aluminum-beryllium alloys which compared to conventional aluminum alloys have superior rigidity and comparable electrical resistance. One of these, which is about 60 percent more rigid and only about 10 percent more electrical resistive than the conventional aluminum alloy, allows construction of air bridges that are 40 percent longer. This advantage ultimately translates into integrated circuits with superior speed and efficiency.

The embodiments described above are intended only to illustrate and teach one or more ways of practicing or implementing the present invention, not to restrict its breadth or scope. The actual scope of the invention, which encompasses all ways of practicing or implementing the invention, is defined only by the following claims and their equivalents.

What is claimed is:

1. An integrated circuit comprising an air bridge having an air-bridge conductor, wherein the air-bridge conductor comprises: 15–30% beryllium, 0–6% copper, 0–2% titanium, and a remainder of aluminum and any impurities.

2. The integrated circuit of claim 1, wherein the air-bridge conductor comprises 0.2–2% copper.

3. The integrated circuit of claim 1, wherein the air-bridge conductor comprises 0.2–1% copper.

4. The integrated circuit of claim 1, wherein the air-bridge conductor comprises less than 0.1% titanium.

5. The integrated circuit of claim 1, wherein any impurities includes reasonably unavoidable impurities.

6. An integrated circuit comprising an air bridge having an air-bridge conductor with an unsupported length greater than 1.2 millimeters, a thickness of 500 nanometers, and a maximum allowable sag of 250 nanometers under its own weight, wherein the air-bridge conductor comprises: 15–30% beryllium, 0–6% copper, 0–2% titanium, and a remainder of aluminum and any reasonably unavoidable impurities.

7. The integrated circuit of claim 6, wherein the air-bridge conductor comprises 0.4–0.6% copper and less than 0.1% titanium.

8. An integrated circuit comprising an air bridge having an air-bridge conductor, wherein the air-bridge conductor comprises: 20–30% beryllium, 0.2–1% copper, less than 0.1% titanium, and a remainder of aluminum and any impurities.

9. The integrated circuit of claim 8, wherein the air-bridge conductor comprises 0.4–0.6% copper.

10. The integrated circuit of claim 8, wherein the air-bridge conductor comprises 24–26% beryllium.

11. The integrated circuit of claim 8, wherein any impurities includes reasonably unavoidable impurities.

12. An integrated circuit comprising an air bridge having an air-bridge conductor with an unsupported length greater than 1.2 millimeters, a thickness of 500 nanometers, and a maximum allowable sag of 250 nanometers under its own weight, wherein the air-bridge conductor comprises: 20–30% beryllium, 0.2–1% copper, less than 0.1% titanium, and a remainder of aluminum and any reasonably unavoidable impurities.

13. The integrated circuit of claim 12, wherein the air-bridge conductor comprises 0.4–0.6% copper.

14. An integrated circuit comprising an air bridge having an air-bridge conductor, wherein the air-bridge conductor comprises: 1–20% beryllium, 0–6% copper, 0–2% titanium, and a remainder of aluminum and any impurities.

15. The integrated circuit of claim 14, wherein the air-bridge conductor comprises 0.2–2% copper.

16. The integrated circuit of claim 14, wherein the air-bridge conductor comprises 0.2–1% copper.

17. The integrated circuit of claim 14, wherein the air-bridge conductor comprises less than 0.1% titanium.

18. The integrated circuit of claim 14, wherein any impurities includes reasonably unavoidable impurities.

19. An integrated circuit comprising an air bridge having an air-bridge conductor with an unsupported length greater than 1.2 millimeters, a thickness of 500 nanometers, and a maximum allowable sag of 250 nanometers under its own weight, wherein the air-bridge conductor comprises: 1–20% beryllium, 0–6% copper, 0–2% titanium, and a remainder of aluminum and any reasonably unavoidable impurities.

20. The integrated circuit of claim 19, wherein the air-bridge conductor comprises 0.2–1% copper.

21. An integrated circuit comprising an air bridge having an air-bridge conductor with an unsupported length greater than 1.2 millimeters, a thickness of 500 nanometers, and a maximum allowable sag of 250 nanometers under its own weight, wherein the air-bridge conductor comprises: 1–20% beryllium.

22. The integrated circuit of claim 21, wherein the air-bridge conductor further comprises 0–6% copper, 0–2% titanium, and a remainder of aluminum and any reasonably unavoidable impurities.

23. An integrated circuit comprising an air bridge having an air-bridge conductor with an unsupported length greater than 1.2 millimeters, a thickness of 500 nanometers, and a maximum allowable sag of 250 nanometers under its own weight, wherein the air-bridge conductor comprises: 10–20% beryllium.

24. The integrated circuit of claim 23, wherein the air-bridge conductor further comprises 0–6% copper, 0–2% titanium, and a remainder of aluminum and any reasonably unavoidable impurities.

25. An integrated circuit comprising an air bridge having an air-bridge conductor with an unsupported length greater than 1.2 millimeters, a thickness of 500 nanometers, and a maximum allowable sag of 250 nanometers under its own weight, wherein the air-bridge conductor comprises: 15–20% beryllium.

26. The integrated circuit of claim 25, wherein the air-bridge conductor further comprises 0–6% copper, 0–2% titanium, and a remainder of aluminum and any reasonably unavoidable impurities.

27. An integrated circuit comprising an air bridge having an air-bridge conductor, wherein the air-bridge conductor comprises: 15–30% beryllium.

28. The integrated circuit of claim 27, wherein the air-bridge conductor further comprises 0–6% copper, 0–2% titanium, and a remainder of aluminum and any impurities.

29. An integrated circuit comprising an air bridge having an air-bridge conductor with an unsupported length greater than 1.2 millimeters, a thickness of 500 nanometers, and a maximum allowable sag of 250 nanometers under its own weight, wherein the air-bridge conductor comprises: 15–30% beryllium.

30. The integrated circuit of claim 29, wherein the air-bridge conductor further comprises 0–6% copper, 0–2% titanium, and a remainder of aluminum and any reasonably unavoidable impurities.

31. An integrated circuit air bridge conductor, comprising an unsupported length greater than 1.2 millimeters, a thickness of 500 nanometers, and a maximum allowable sag of 250 nanometers under its own weight, wherein the air-bridge conductor consists essentially of aluminum, beryllium, and copper.

32. An integrated circuit air bridge conductor, comprising an unsupported length greater than 1.2 millimeters, a thickness of 500 nanometers, and a maximum allowable sag of 250 nanometers under its own weight, wherein the air-bridge conductor consists essentially of aluminum, beryllium, and titanium.

33. An integrated circuit having an air bridge conductor, the air-bridge conductor comprising: and alloy of 15–30% beryllium, 0–6% copper, 0–2% titanium, and the remainder aluminum and any impurities.

34. An integrated circuit having an air bridge conductor comprising: an alloy of 15–30% beryllium and a remainder of aluminum and no more than 10% of other elements combined.

35. An integrated circuit having an air bridge conductor comprising: an alloy of 15–30% beryllium, 0–6% copper, and a remainder of aluminum and less than 1% impurities.

36. An integrated circuit having an air bridge conductor comprising: an alloy of 15–30% beryllium, 0–2% titanium, and a remainder of aluminum and less than 1% impurities.

* * * * *